(12) United States Patent
Kuroda (10) Patent No.: US 8,138,819 B2
(45) Date of Patent: Mar. 20, 2012

(54) DRIVING TRANSISTOR CONTROL CIRCUIT

(75) Inventor: Takao Kuroda, Nagoya (JP)

(73) Assignee: Denso Corporation, Kariya (JP)

( * ) Notice: Subject to any disclaimer, the term of this patent is extended or adjusted under 35 U.S.C. 154(b) by 381 days.

(21) Appl. No.: 12/458,484

(22) Filed: Jul. 14, 2009

(65) Prior Publication Data

US 2010/0013542 A1    Jan. 21, 2010

(30) Foreign Application Priority Data

Jul. 18, 2008  (JP) ................................ 2008-187094
Jul. 18, 2008  (JP) ................................ 2008-187095
Feb. 6, 2009  (JP) ................................. 2009-25982

(51) Int. Cl.
    *H03K 17/04* (2006.01)
(52) U.S. Cl. ........ 327/374; 327/376; 327/377; 327/427; 327/108
(58) Field of Classification Search .......... 327/108–112, 327/374, 376, 377, 427, 432–434, 436, 437
    See application file for complete search history.

(56) References Cited

U.S. PATENT DOCUMENTS

| | | | | |
|---|---|---|---|---|
| 6,788,128 | B2 * | 9/2004 | Tsuchida | 327/427 |
| 7,436,225 | B2 * | 10/2008 | Arashima et al. | 327/108 |
| 2003/0197532 | A1 * | 10/2003 | Tsuchida | 327/108 |
| 2006/0267665 | A1 | 11/2006 | Kawamoto | |
| 2007/0222485 | A1 * | 9/2007 | Ueda | 327/108 |

FOREIGN PATENT DOCUMENTS

| | | |
|---|---|---|
| JP | A-S64-039818 | 2/1989 |
| JP | U-H1-133823 | 9/1989 |
| JP | A-02-134923 | 5/1990 |
| JP | U-4-76736 | 7/1992 |
| JP | A-H04-368080 | 12/1992 |
| JP | A-H05-283998 | 10/1993 |
| JP | A-H7-066711 | 3/1995 |
| JP | A-H7-135456 | 5/1995 |
| JP | A-H8-274606 | 10/1996 |
| JP | A-H09-008639 | 1/1997 |
| JP | A-H11-136108 | 5/1999 |

OTHER PUBLICATIONS

Office Action mailed Dec. 7, 2010 from the Japan Patent Office for corresponding Japanese patent application No. 2008-187095 (English translation enclosed).
Office Action mailed Apr. 13, 2010 from the Japan Patent Office for corresponding patent application No. 2008-187095 (English translation enclosed).

* cited by examiner

*Primary Examiner* — Long Nguyen
(74) *Attorney, Agent, or Firm* — Posz Law Group, PLC (57) ABSTRACT

A control circuit controls a driving transistor connected in series with an electrical load between a power supply voltage and a ground. The control circuit includes a pull-up resistor connected at one end to a power supply voltage side of the driving transistor, a current detection resistor for detecting an electric current flowing from the driving transistor to the ground, a current mirror circuit including a starting transistor connected between the pull-up transistor and the current detection resistor. The current mirror circuit supplies a mirror current of the electric current. The control circuit further includes a current source circuit for supplying a driving current to a control terminal of the driving transistor in accordance with the mirror current to turn ON the driving transistor in response to an external control signal.

5 Claims, 8 Drawing Sheets

DRIVING TRANSISTOR CONTROL CIRCUIT

CROSS REFERENCE TO RELATED APPLICATION

This application is based on and incorporates herein by reference Japanese Patent Application No. 2008-187094 filed on Jul. 18, 2008, No. 2008-187095 filed on Jul. 18, 2008, and No. 2009-25982 filed on Feb. 6, 2009.

FIELD OF THE INVENTION

The present invention relates to a control circuit for controlling ON and OFF of a driving transistor connected in series with an external electrical load between a power supply voltage and a ground.

BACKGROUND OF THE INVENTION

In a device for diving an electrical load by supplying a direct current to the electrical load through a driving transistor (i.e., output driver), switching noise occurs due to a change in the current flowing through the electrical load. As one simple approach to reduce such switching noise, a resistance value of a resistor connected to the gate of the driving transistor is increased so that a gas signal waveform can be slowed due to a RC time constant of the resistance value and a gate capacitance. However, when a gate signal level exceeds a threshold voltage Vt of a FET, an energizing current increases sharply. Therefore, this approach may be insufficient to reduce harmonic noise.

As another approach to reduce such switching noise, a gate signal is caused to have a trapezoidal waveform. This approach can reduce a low-order harmonic wave but cannot reduce a high-order harmonic wave caused by corner portions of the trapezoidal waveform. US 2006/0267665 corresponding to JP-A-2007-13916 discloses a structure for causing a gate signal to have a near-sinusoidal waveform, thereby reducing such switching noise.

However, since the structure disclosed in US 2006/0267665 needs many current sources and comparators, the structure is increased in size and complexity.

JP-A-H9-8639 discloses a structure for preventing a shoot-through current from flowing between a power supply voltage and a ground in a signal output section of a CMOS. In the structure, multiple FETs are connected on each of a PMOS side and a NMOS side to remove a timing lag when each FET is switched to an OFF state and to create a timing lag when each FET is switched to an ON state. This structure may prevent the shoot-through current. However, since an electric current greatly changes when the gate voltage of each FET changes near a threshold voltage Vt of the FET, a noise reduction effect may be small. Further, the structure disclosed in JP-A-H9-8639 is increased in size and complexity.

JP-A-H11-136108 discloses a structure for reducing a switching noise. In the structure, multiple P-channel MOS-FETs for signal output are connected in parallel, and the gate of each FET is individually provided with a level shift circuit. Further, ON-timings of the FETs are changed by using multiple delay circuits so as to reduce the switching noise. However, the structure disclosed in JP-A-H11-136108 is increased in size and complexity compared to the structure disclosed in JP-A-H9-8639.

SUMMARY OF THE INVENTION

In view of the above, it is an object of the present invention to provide a driving transistor control circuit having a simple structure for effectively reducing switching noise associated with a switching operation of a driving transistor.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
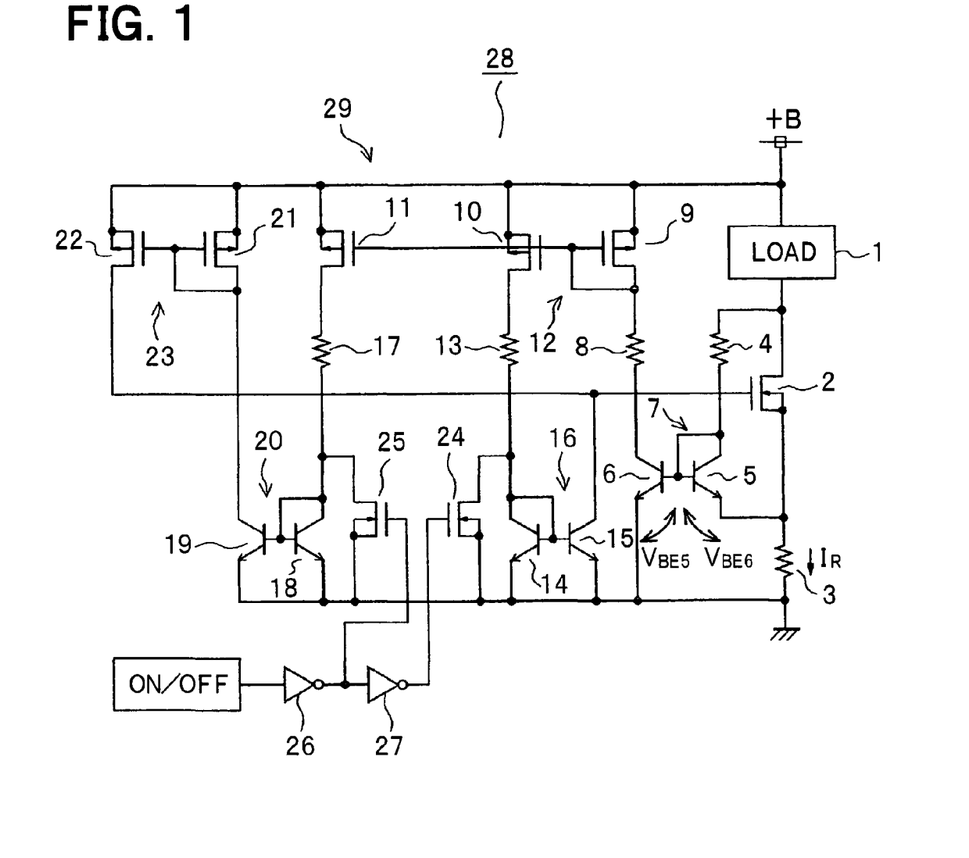
FIG. 1 is a schematic diagram of a driving transistor control circuit according to a first embodiment of the present invention.
Figure 2:
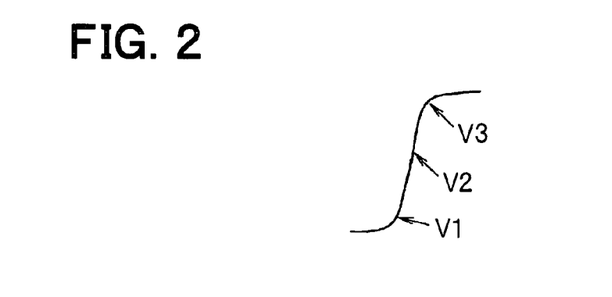
FIG. 2 is a diagram illustrating a waveform of a voltage applied to the gate of a MOSFET acting as a driving transistor.
Figure 3:
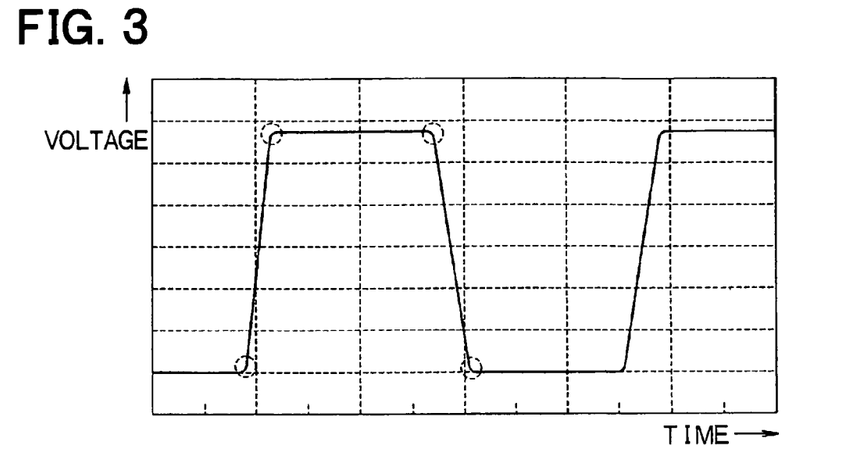
FIG. 3 is a diagram illustrating a result of a simulation conducted to measure a waveform of an output voltage of the MOSFET.

A first embodiment of the present invention is described below with reference to FIGS. 1-3. A series circuit of an external electrical load 1, an N-channel MOSFET 2 acting as a driving transistor, and a current detection resistor 3 for current detection is connected between a power supply voltage +B and a ground. Examples of the electrical load 1 can include a DC motor, a lamp, and an inductor. A series circuit of a pull-up resistor 4 and a NPN transistor 5 acting as a starting transistor is connected between the drain and the source of the MOSFET 2. For example, the current detection resistor 3 has a resistance value of about a few tens of ohms ($\Omega$), and the pull-up resistor 4 has a resistance value of about a few hundred kilohms (k$\Omega$).

The NPN transistor 5 and a NPN transistor 6 form a first current mirror circuit 7 acting as a current control current mirror circuit. The bases of the NPN transistors 5, 6 are connected to the collector of the NPN transistor 5. The emitter of the NPN transistor 6 is connected to the ground, and the collector of the NPN transistor 6 is connected to the power supply voltage +B via a resistor 8 and a P-channel MOSFET 9. The MOSFET 9, a P-channel MOSFET 10, and a P-channel MOSFET 11 form a second current mirror circuit 12. The gates of the MOSFETs 9-11 are connected to the drain of the MOSFET 9.

The drain of the MOSFET 10 is connected to the ground via a resistor 13 and a NPN transistor 14. The NPN transistor 14 and a NPN transistor 15 form a third current mirror circuit 16. The bases of the NPN transistors 14, 15 are connected to the collector of the NPN transistor 14. The collector of the NPN transistor 15 acting as a mirror side transistor is connected to the gate of the MOSFET 2. The gate of the MOSFET 2 serves as a control terminal.

The drain of the MOSFET 11 is connected to the ground via a resistor 17 and a NPN transistor 18. The NPN transistor 18 and a NPN transistor 19 form a fourth current mirror circuit 20. The bases of the NPN transistors 18,19 are connected to the collector of the NPN transistor 18. The collector of the NPN transistor 19 is connected to the power supply voltage +B via a P-channel MOSFET 21. The MOSFET 21 and a P-channel MOSFET 22 form a fifth current mirror circuit 23. The gates of the MOSFETs 21, 22 are connected to the drain of the MOSFET 21. The drain of the MOSFET 22 is connected to the gate of the MOSFET 2.

An N-channel MOSFET 24 is connected in parallel to the NPN transistor 14, and an N-channel MOSFET 25 is connected in parallel to the NPN transistor 18. A control signal for controlling ON and OFF of the MOSFET 2 is supplied to the gate of the MOSFET 25 via a NOT gate 26. The control signal passing through the NOT gate 26 is supplied to the gate of the MOSFET 24 via a NOT gate 27. The above described circuit components except the electrical load 1 and the MOSFET 2 construct a driving transistor control circuit 28. Further, a portion of the driving transistor control circuit 28 excluding the first current mirror circuit 7 constructs a driving current source circuit 29.

Advantages of the first embodiment are described below with further reference to FIGS. 2 and 3. An electric current always flows from the pull-up resistor 4 to the current detection resistor 3 via the NPN transistor 5 regardless of whether the MOSFET 2 is ON or OFF. Accordingly, the first current mirror circuit 7 is always ON so that the second current mirror circuit 12 can be always ON.

The control signal for the MOSFET 2 is supplied from an external circuit. When the control signal for the MOSFET 2 is at a low level, the MOSFET 24 is turned OFF, and the MOSFET 25 is turned ON. Accordingly, the fifth current mirror circuit 23 is turned OFF. As a result, the gate potential of the MOSFET 2 becomes a low level so that the MOSFET 2 can be turned OFF. In the present embodiment, the pull-up resistor 4 has a high resistance value, and the current detection resistor 3 has a low resistance value. Therefore, the emitter potential of the NPN transistor 5 is kept close to the ground potential so that a small amount of current limited by the pull-up resistor 4 can flow through the NPN transistor 5.

Then, when the control signal for the MOSFET 2 changes from the low level to the high level, the MOSFET 24 is turned ON, and the MOSFET 25 is turned OFF. Accordingly, the fifth current mirror circuit 23 is turned ON. As a result, the gate potential of the MOSFET 2 becomes the high level so that the MOSFET 2 can be turned ON. This turn-ON process of the MOSFET 2 is described below with reference to FIG. 2 by dividing gate voltage rise of the MOSFET 2 in three stages, i.e., early stage V1, middle stage V2, and last stage V3

(Early Stage of Gate Voltage Rise)

Since an electric current supplied to the gate of the MOSFET 2 from the fifth current mirror circuit 23 is a mirror current of a collector current of the NPN transistor 5 of the first current mirror circuit 7, the electric current eventually depends on the energization state of the first current mirror circuit 7. At the early stage of the gate voltage rise, since a base-emitter voltage Vbe5 of the NPN transistor 5 becomes substantially equal to a base-emitter voltage Vbe6 of the NPN transistor 6, the fifth current mirror circuit 23 supplies a small amount of current limited by the pull-up resistor 4 having the high resistance value. Therefore, as shown in FIG. 2, a waveform of the gate voltage is gentle at the early stage V1.

(Middle Stage of Gate Voltage Rise)

When the MOSFET 2 is turned ON according to the rise in the gate voltage, an electric current IR supplied via the MOSFET 2 to the current detection resistor 3 increases. Accordingly, a voltage drop across the current detection resistor 3 increases. In this case, the base-emitter voltages Vbe5, Vbe6 of the NPN transistors 5, 6 have the following relationship: Vbe6=Vbe5+R×IR, where R represents the resistance value of the current detection resistor 3. That is, a mirror ratio of the first current mirror circuit 7 increases equivalently with a change in a ratio between the base-emitter voltages Vbe5, Vbe6. And, the electric current supplied from the fifth current mirror circuit 23 increases sharply so that the gate voltage of the MOSFET 2 can increase sharply. Therefore, as shown in FIG. 2, the waveform of the gate voltage is sharp at the middle stage V2.

(Last Stage of Gate Voltage Rise)

Then, when the MOSFET 2 is substantially fully turned ON, a voltage drop across the pull-up resistor 4 becomes very small so that an electric current passing through the NPN transistor 5 can decrease. Therefore, as shown in FIG. 2, the waveform of the gate voltage becomes gentle at the last stage V3.

By the way, when the control signal for the MOSFET 2 changes to the low level from this state so that the MOSFET 2 can be turned OFF, the above turn-ON process is reversely followed. FIG. 3 is a diagram illustrating a result of a simulation conducted to measure a waveform of an output voltage (i.e., drain-ground voltage) of the MOSFET 2. As indicated by circles in FIG. 3, the waveform of the output voltage has rounded corners where the output voltage starts and finish rising. Accordingly, the waveform of the output voltage is gentle as a whole.

As described above, according to the first embodiment, the NPN transistor 5 is connected between the current detection resistor 3 and the pull-up resistor 4, and the first current mirror circuit 7 supplies a mirror current of an electric current passing through the current detection resistor 3 and the pull-up resistor 4. When the MOSFET 2 is turned ON in accordance with the control signal, the driving current source circuit 29 supplies a driving current to the gate of the MOSFET 2 in accordance with the mirror current supplied from the first current mirror circuit 7. In such an approach, when the voltage applied to the gate of the MOSFET 2 starts rising during the turn-ON process of the MOSFET 2, the change in the gate voltage is reduced. Further, when the voltage applied to the gate of the MOSFET 2 finishes rising during the turn-ON process of the MOSFET 2 due to the fact that the MOSFET 2 is almost fully turned ON, the change in the gate voltage is reduced. Therefore, when the MOSFET 2 is switched between On and OFF states, the change in the output voltage of the MOSFET 2 is reduced. Thus, in particular, switching noise caused by high-order harmonic wave can be reduced.

When the third and fourth current mirror circuits 16, 20 are turned OFF and ON, respectively, to turn ON the MOSFET 2, the mirror current supplied from the first current mirror circuit 7 is successively mirrored by the second, fourth and fifth current mirror circuits 12, 20, 23. Thus, the fifth current mirror circuit 23 supplies the driving current to the gate of the MOSFET 2 so that the MOSFET 2 can be turned ON. In contrast, when the third and fourth current mirror circuits 16, 20 are turned ON and OFF, respectively, to turn OFF the MOSFET 2, the supply of the driving current to the gate of the MOSFET 2 from the fifth current mirror circuit 23 is stopped. Thus, the third current mirror circuit 16 causes the gate of the MOSFET 2 to be set to the potential that can turn OFF the MOSFET 2.

Second Embodiment

Figure 4:
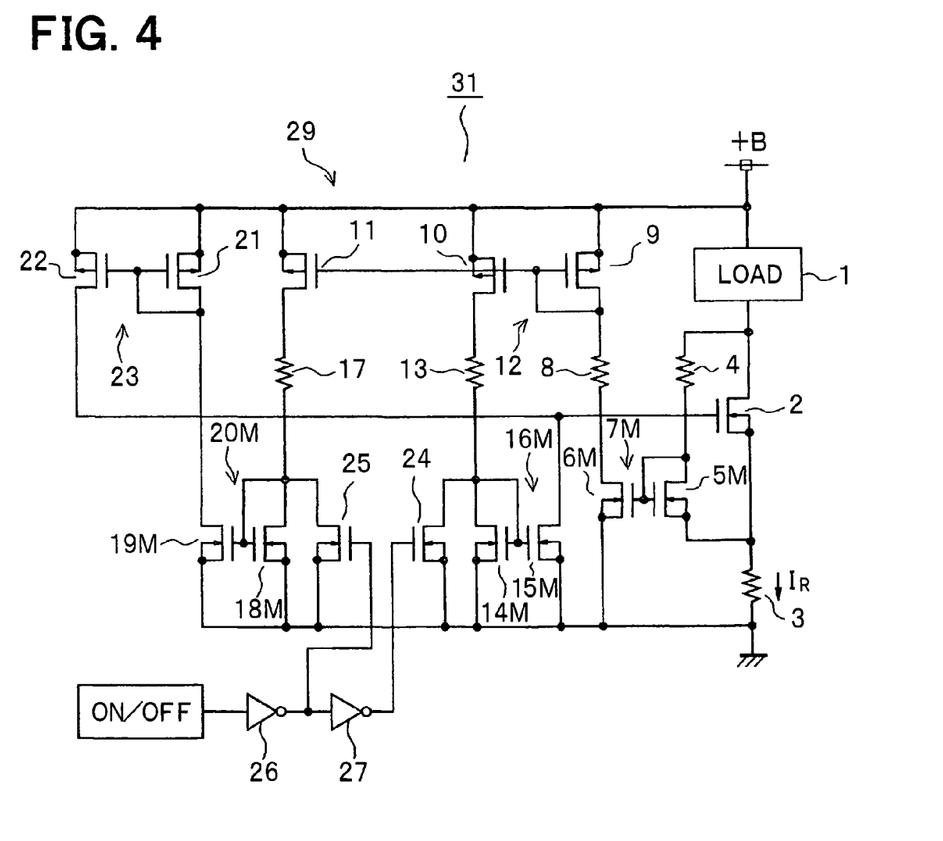
FIG. 4 is a schematic diagram of a driving transistor control circuit according to a second embodiment of the present invention.

A driving transistor control circuit 31 according to a second embodiment of the present invention is described below with reference to FIG. 4. A difference between the first and second embodiments is as follows. The driving transistor control circuit 31 includes N-channel MOSFETs 5M, 6M, 14M, 15M, 18M, and 19M instead of the NPN transistors 5, 6, 14, 15, 18, and 19 of the driving transistor control circuit 28. The MOSFETs 5M, 6M form a first current mirror circuit 7M instead of the first current mirror circuit 7. The MOSFETs 14M, 15M form a third current mirror circuit 16M instead of the third current mirror circuit 16. The MOSFETs 18M, 19M form a fourth current mirror circuit 20M instead of the fourth current mirror circuit 20.

The driving transistor control circuit 28 of the first embodiment is constructed with both a MOSFET and a bipolar transistor and suitably designed based on a difference in operating speed between a MOSFET and a bipolar transistor. In contrast, the driving transistor control circuit 31 of the second embodiment is constructed with only a MOSFET. That is, kinds of transistors used to form a driving transistor control circuit are not limited. The driving transistor control circuit 31 can have the same advantages as the driving transistor control circuit 28.

Third Embodiment

Figure 5:
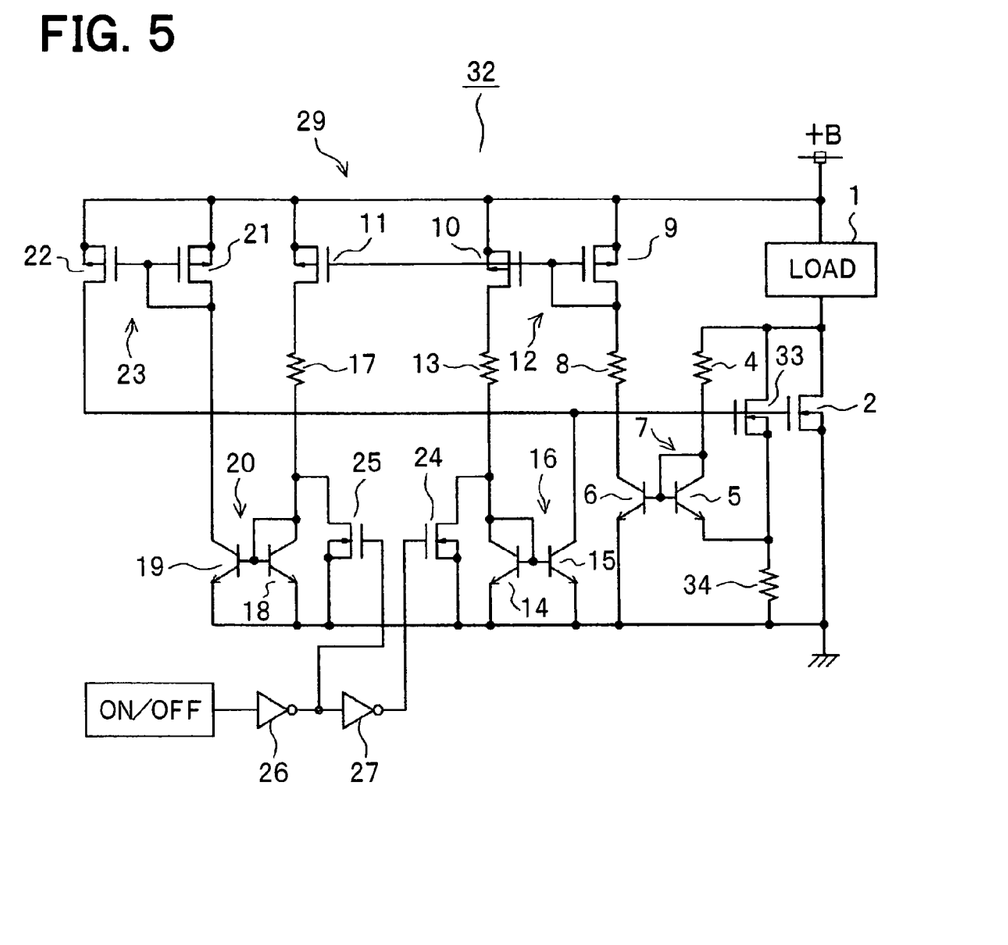
FIG. 5 is a schematic diagram of a driving transistor control circuit according to a third embodiment of the present invention.

A driving transistor control circuit 32 according to a third embodiment of the present invention is described below with reference to FIG. 5. A difference between the first and third embodiments is as follows. As compared to the driving transistor control circuit 28, the driving transistor control circuit 32 further includes an N-channel MOSFET 33 acting as a current detection transistor. The source of the MOSFET 2 is directly connected to the ground. The drain and gate of the MOSFET 33 are connected to the drain and gate of the MOSFET 2, respectively. The source of the MOSFET 33 is connected to the ground via a current detection resistor 34.

In such an approach, an electric current flowing through the MOSFET 33 can be smaller than an electric current flowing through the MOSFET 2. Therefore, even when the electric current flowing through the MOSFET 2 is relatively large, an electric current flowing through the current detection resistor 34 becomes small. Therefore, the electric current can be easily detected.

Fourth Embodiment

Figure 6:
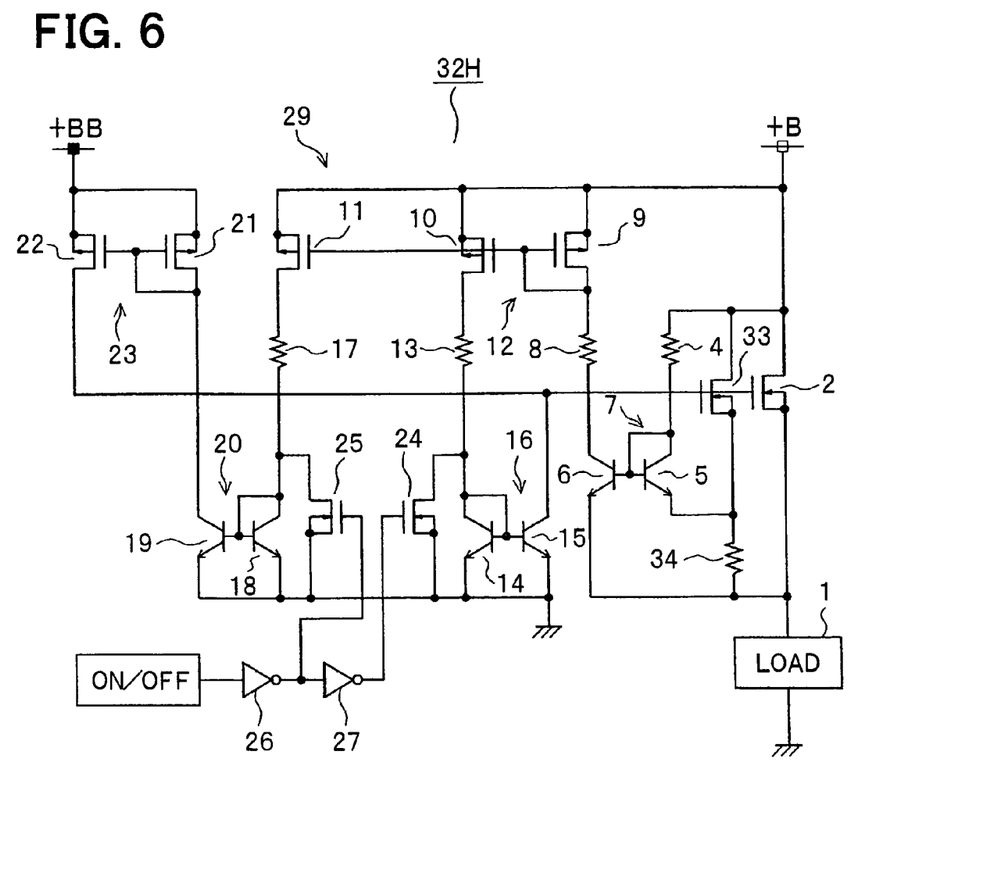
FIG. 6 is a schematic diagram of a driving transistor control circuit according to a fourth embodiment of the present invention.

A driving transistor control circuit 32H according to a fourth embodiment of the present invention is described below with reference to FIG. 6. A difference between the third and fourth embodiments is as follows. The driving transistor control circuit 32H is achieved by modifying the driving transistor control circuit 32 in a high side drive configuration. That is, the electrical load 1 is connected between the source of the MOSFET 2 and the ground. The emitters of the transistors 5, 6 and a lower potential side of the current detection resistor 34 are connected to the ground via the electrical load 1. The sources of the MOSFETs 21, 22 of the fifth current mirror circuit 23 that supplies the driving current to the gate of the MOSFET 2 is connected to a power supply voltage +BB that is greater than the power supply voltage +B. The power supply voltage +BB can be produced by boosting the power supply voltage +B.

As describe above, according to the fourth embodiment, the present invention can be applied to a high side drive configuration.

Fifth Embodiment

Figure 7:
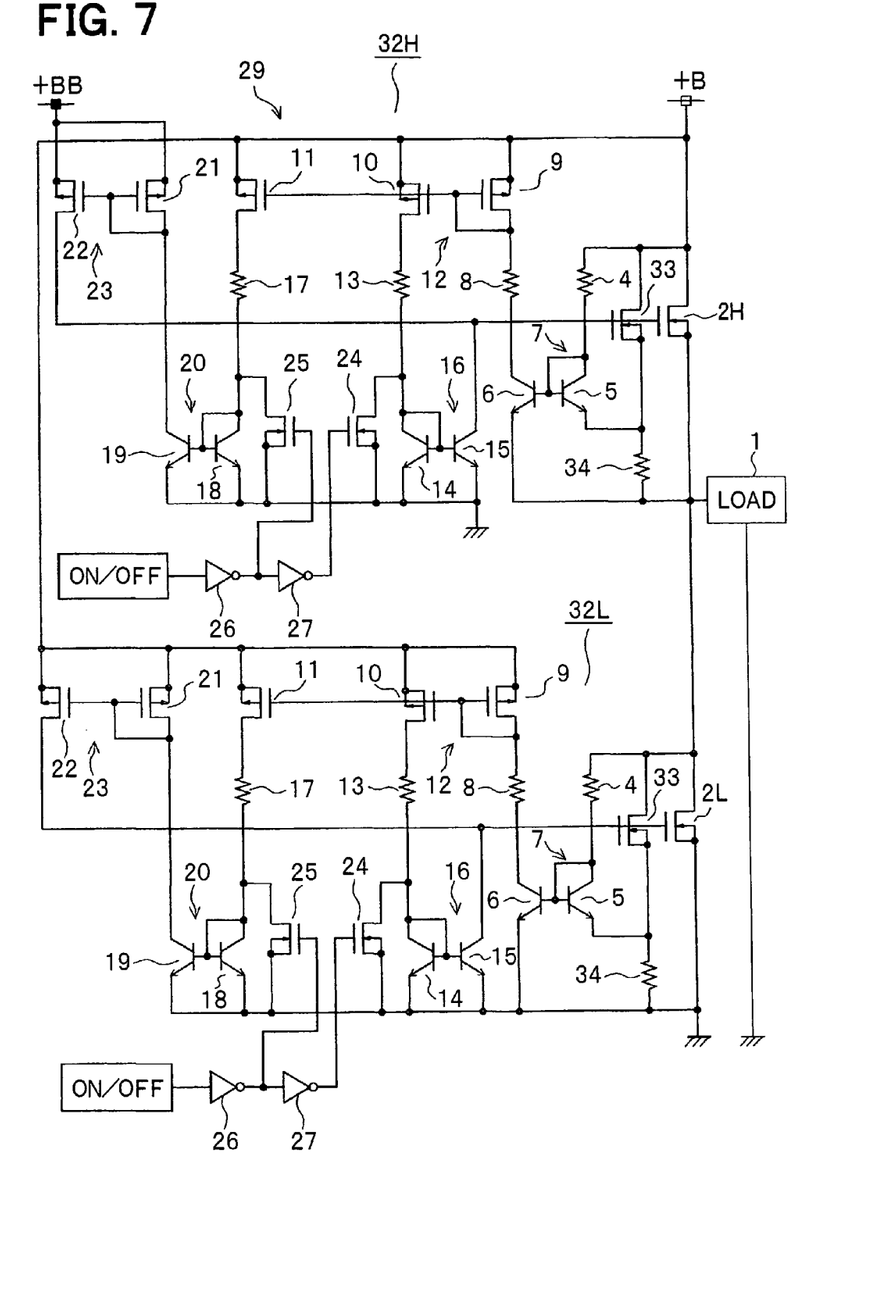
FIG. 7 is a schematic diagram of a driving transistor control circuit according to a fifth embodiment of the present invention.

A fifth embodiment of the present invention is described below with reference to FIG. 7. In the fifth embodiment, the driving transistor control circuits 32, 32H of the third and fifth embodiments are connected in a totem pole configuration. A junction between the source of a MOSFET 2H of a driving transistor control circuit 32H and the drain of a MOSFET 2L of a driving transistor control circuit 32L is connected to the electrical load 1.

The MOSFETs 2H, 2L are supplied with control signals that cause the MOSFETs 2H, 2L to be exclusively turned ON. When the MOSFET 2H is turned ON, a source current is supplied to the electrical load 1. In contrast, when the MOSFET 2L is turned ON, a sink current is drawn from the electrical load 1. As described above, according to the fifth embodiment, two driving transistor control circuits 32L, 32H are connected in a totem pole configuration. In such an approach, the electrical load 1 can be driven by switching the source current and the sink current.

Sixth Embodiment

Figure 8:
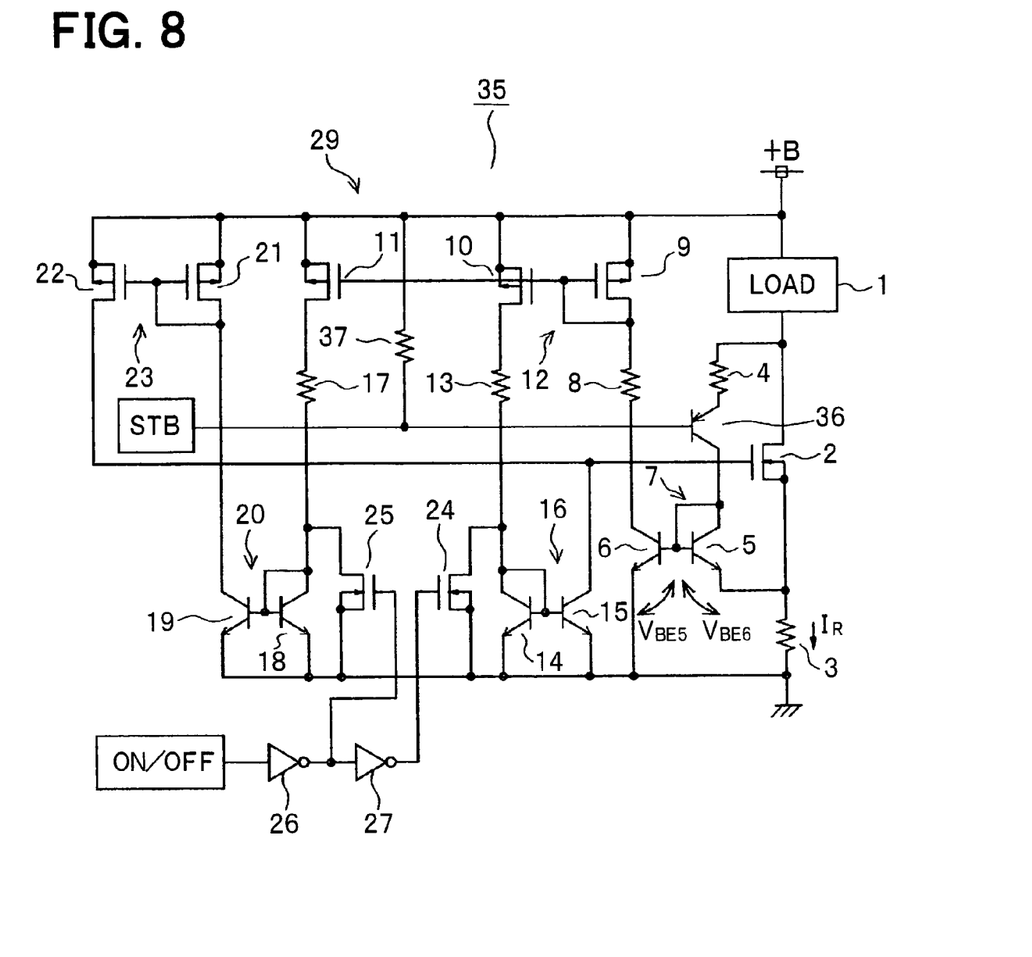
FIG. 8 is a schematic diagram of a driving transistor control circuit according to a sixth embodiment of the present invention.

A driving transistor control circuit 35 according to a sixth embodiment of the present invention is described below with reference to FIG. 8. A difference between the first and sixth embodiments is as follows. As compared to the driving transistor control circuit 28, the driving transistor control circuit 35 further includes a PNP transistor 36 acting as a current interrupting switch and a resistor 37. The PNP transistor 36 is connected between the pull-up resistor 4 and the NPN transistor 5. Specifically, the emitter of the PNP transistor 36 is connected to the pull-up resistor 4, and the collector of the PNP transistor 36 is connected to the collector of the NPN transistor 5. The base of the PNP transistor 36 is connected to the power supply voltage +B via the resistor 37. A control signal STB of high active is applied to the base of the PNP transistor 36.

Advantages of the sixth embodiment are described below. For example, when there is a need to activate an output stage of the driving transistor control circuit 35 as in the first embodiment, the control signal STB is set to a low level so that the PNP transistor 36 can be turned ON. Thus, an electric current is supplied via the pull-up resistor 4 to the NPN transistors 5, 6 of the first current mirror circuit 7. In contrast, when there is no need to activate the output stage of the driving transistor control circuit 35, the control signal STB is set to a high level so that the PNP transistor 36 can be turned OFF. Thus, the supply of the electric current via the pull-up resistor 4 to the first current mirror circuit 7 is interrupted. For example, when the MOSFET 2 is kept ON or OFF for a long time period, the control signal STB can be set to a high level. For another example, the control signal STB can be set to a high level during a time period excluding rising and falling periods of turn-ON and turn-OFF of the MOSFET 2.

As described above, according to the sixth embodiment, a leak current flowing via the pull-up resistor 4 is reduced so that a consumption current can be reduced. Further, the PNP transistor 36 acts as a current interrupting switch. Therefore, the electric current flowing via the pull-up resistor 4 can be controlled by controlling ON and OFF of the PNP transistor 36.

(Modification)

The embodiments described above can be modified in various ways. For example, the driving transistor control circuit can be constructed with only a bipolar transistor. In the fifth embodiment, another one set of the driving transistor control circuits 32H, 32L can be used to form a H-bridge circuit for switching an energization direction of the electrical load 1. In the sixth embodiment, the current interrupting switch can be constructed with a transistor other than a PNP transistor. For example, the current interrupting switch can be constructed with a P-channel MOSFET, a NPN transistor, or an N-channel MOSFET. The current interrupting switch of the sixth embodiment can be applied to the second to fifth embodiments.

Seventh Embodiment

Figure 9:
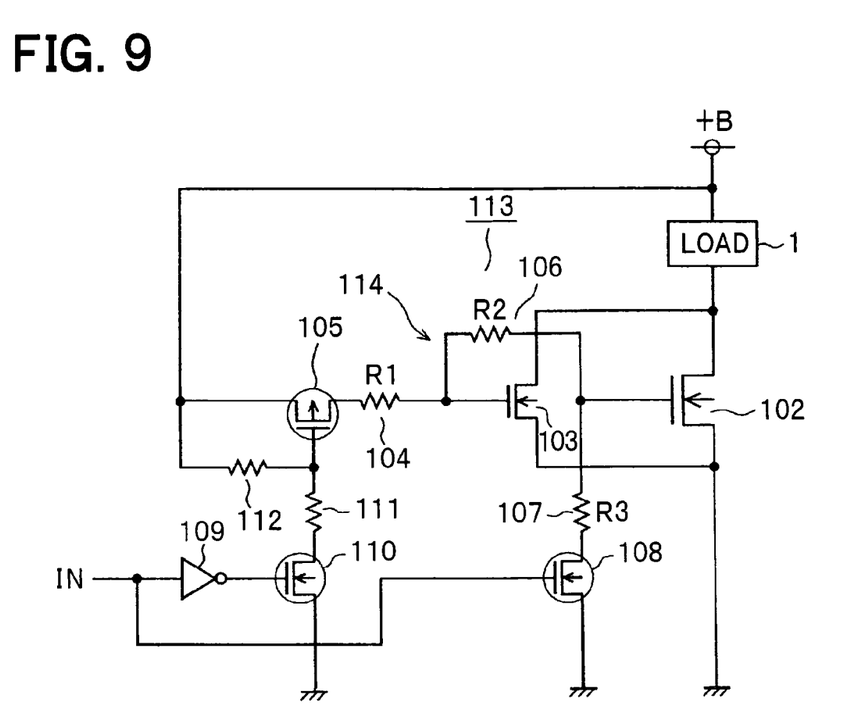
FIG. 9 is a schematic diagram of a driving transistor control circuit according to a seventh embodiment of the present invention.

A seventh embodiment of the present invention is described below with reference to FIG. 9. A series circuit of the electrical load 1 and an N-channel MOSFET 102 acting as a primary driving transistor is connected between the power supply voltage +B and the ground. The MOSFET 102 is a power MOSFET and large in size (e.g., gate width and gate length). For example, the MOSFET 102 can be formed as a LDMOS (laterally diffused MOS). An N-channel MOSFET 103 acting as a secondary driving transistor is connected in parallel with the MOSFET 102. The MOSFET 103 is smaller in size than the MOSFET 102 and larger in ON-resistance than the MOSFET 102.

The gate (i.e., control terminal) of the MOSFET 103 is connected to the power supply voltage +B via a resistor 104 acting as a first resistor and a P-channel MOSFET 105 acting as a control transistor. Further, the gate of the MOSFET 103 is connected to the gate of the MOSFET 102 via a resistor 106 acting as a second resistor. The gate of the MOSFET 102 is also connected to the ground via a resistor 107 acting as a third resistor and an N-channel MOSFET 108 acting as a second control transistor.

A control signal IN for controlling ON and OFF of the MOSFET 102 is supplied to the gate of the MOSFET 108 from an external circuit. Further, the control signal IN is applied via a NOT gate 109 to the gate of an N-channel MOSFET 110 acting as a third control transistor. The source of the MOSFET 110 is connected to the ground. The drain of the MOSFET 110 is connected via a resistor 111 to the gate of the MOSFET 105. The gate of the MOSFET 105 is connected via a resistor 112 to each of the power supply voltage +B and the source of the MOSFET 102.

The above described circuit components except the electrical load 1 and the MOSFET 102 construct a driving transistor control circuit 113. Further, a portion of the driving transistor control circuit 113 excluding the MOSFET 103 constructs an energization control circuit 114.

Advantages of the seventh embodiment are described below.

(Turn-ON Operation of MOSFET 102)

When the control signal IN is at a low level, the control signal commands the MOSFET 102 to be turned ON. In this case, the MOSFET 108 is turned OFF, and the MOSFET 110 is turned ON. As a result, the gate potential of the MOSFET 105 is reduced below the power supply voltage +B so that the MOSFET 105 can be turned ON. Accordingly, the power supply voltage +B is applied via the resistor 104 to the gate of the MOSFET 103. Then, the gate potential of the MOSFET 103 gradually increases in accordance with a time constant of a resistance value R1 of the pull-up resistor 4 and a gate capacitance of the MOSFET 103. As a result, the MOSFET 103 is turned ON. In this way, a small amount of current flows through the MOSFET 103 having a high ON-resistance.

Since the power supply voltage +B is applied via the resistor 106 to the gate of the MOSFET 102, turn-ON of the MOSFET 102 is lessened by the time constant of a resistance value R2 of the resistor 106 and the gate capacitance of the MOSFET 102. Therefore, the MOSFET 102 is turned ON later than the MOSFET 103 so that the amount of an energization current flowing through the electrical load 1 can be increased. In this turn-ON operation of the MOSFET 102, the amount of change in the energization current flowing through the electrical load 1 becomes small, as compared to when only the MOSFET 102 is turned ON.

(Turn-OFF Operation of MOSFET 102)

When the control signal is at a high level, the control signal commands the MOSFET 102 to be turned OFF. In this case, the MOSFET 108 is turned ON, and the MOSFET 110 is turned OFF. Then, the gate of the MOSFET 103 is connected via the resistor 107 to the ground, so that the gate potential of the MOSFET 103 gradually decreases in accordance with a time constant of a resistance value R3 of the resistor 107 and the gate capacitance of the MOSFET 102. Therefore, the MOSFET 102 is turned OFF earlier than the MOSFET 103.

Since the ground potential is applied via the resistor 106 to the gate of the MOSFET 103, the gate potential of the MOSFET 103 decreases at a time constant of the resistance value R2 of the resistor 106 and the gate capacitance of the MOSFET 103 in addition to the resistance value R3 and the gate capacitance of the MOSFET 108. Thus, a turn-ON of the MOSFET 103 is lessened. Accordingly, the MOSFET 103 is turned OFF later than the MOSFET 102 so that the electrical load 1 can be de-energized. The resistance values of the resistors 104, 106, 107, 111 are selected by taking into consideration the time constant according to the gate capacitances of the MOSFETs 102, 103, 105.

As described above, according to the seventh embodiment, the MOSFET 103 connected in parallel to the MOSFET 102 is smaller in size than the MOSFET 102 and larger in ON-resistance than the MOSFET 102. When the MOSFET 102 is commanded to be turned ON, the energization control circuit 114 turns ON the MOSFET 103 before turning ON the MOSFET 102. That is, when the MOSFET 102 is commanded to be turned ON, the MOSFET 103 is turned ON earlier than the MOSFET 102. In such an approach, the MOSFET 102 is turned ON, after a small amount of electric current flows through the electrical load 1. Therefore, as compared to when the switching is performed by only the MOSFET 102, the degree of change in electric current is lessened. In contrast, when the MOSFET 102 is commanded to be turned OFF, the energization control circuit 114 turns OFF the MOSFET 103 after turning OFF the MOSFET 102. In such an approach, an increase in the degree of change in electric current can be prevented, although the MOSFETs 102, 103 are connected in parallel with each other. Accordingly, switching noise can be reduced.

Upon receipt of the control signal IN that commands the MOSFET 102 to be turned ON, the energization control circuit 114 turns ON the MOSFET 105 so as to turn ON the MOSFET 103. In this case, the energization control circuit 114 lessens the turn-ON of the MOSFET 103 by the time constant of the resistance value R1 of the resistor 104 and the gate capacitance of the MOSFET 103. Further, since the power supply voltage +B is applied to the gate of the MOSFET 102 via the resistor 106, the turn-ON of the MOSFET 103 is lessened by the time constant of the resistance value R2 of the resistor 106 and the gate capacitance of the MOSFET 102. Thus, the MOSFET 102 is turned ON later than the MOSFET 103.

In contrast, upon receipt of the control signal IN that commands the MOSFET 102 to be turned OFF, the energization control circuit 114 turns ON the MOSFET 108 so as to turn OFF the MOSFET 102. In this case, since the ground potential is applied to the gate of the MOSFET 103 via the resistors 106, 107, the MOSFET 103 is turned OFF later than the MOSFET 102 by the time constant of the resistance value R2 of the resistor 106 and the gate capacitance of the MOSFET 108.

Further, ON and OFF of the MOSFET 108 and the MOSFET 110 are exclusively controlled in accordance with the control signal IN for the MOSFET 102. In such an approach, when the control signal IN commands the MOSFET to be turned ON, the gate of the MOSFET 105 is supplied with the potential that turns ON the MOSFET 105. In this way, the MOSFET 105 is controlled in conjunction with the MOSFET 108. Thus, the energization control circuit 114 can be easily implemented.

Eighth Embodiment

Figure 10:
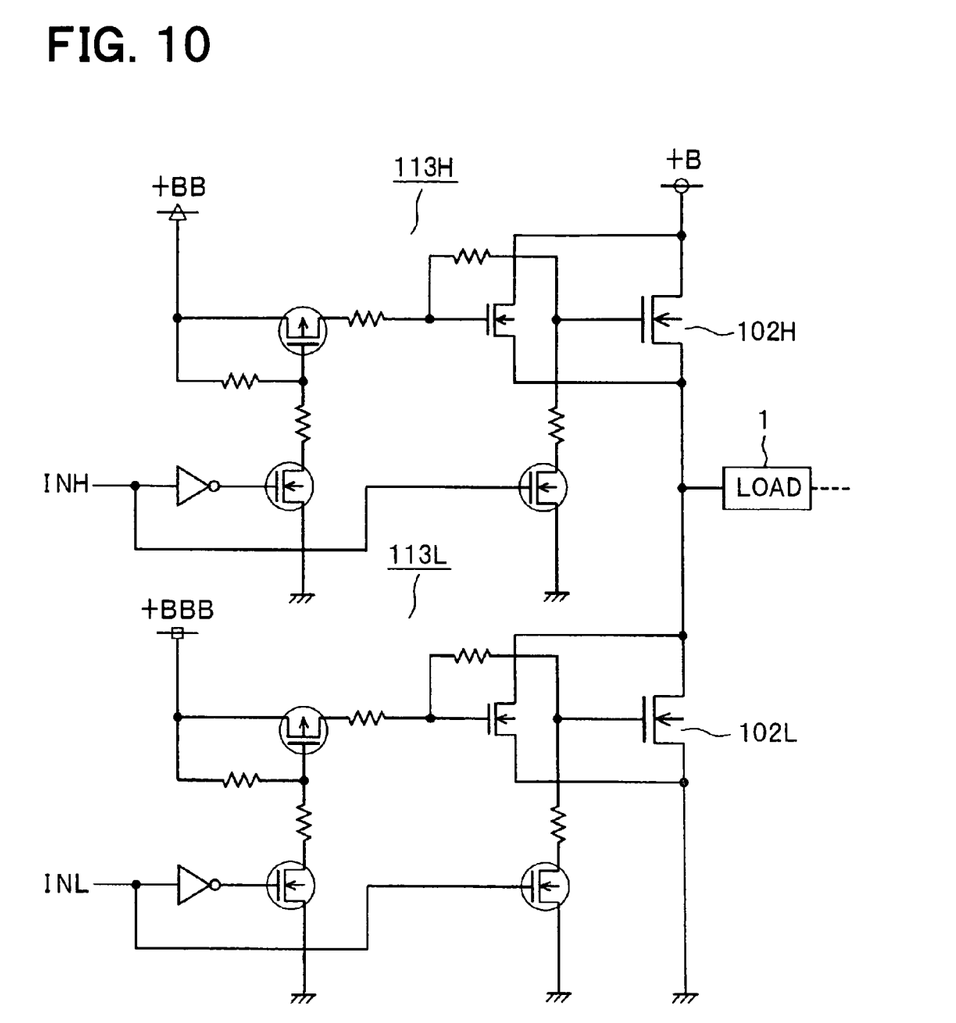
FIG. 10 is a schematic diagram of a driving transistor control circuit according to an eighth embodiment of the present invention.

An eighth embodiment of the present invention is described below with reference to FIG. 10. A difference between the seventh and eighth embodiments is as follows. In the eighth embodiment, four driving transistor control circuits 113, each of which is configured as described in the seventh embodiment, are connected to form a H-bridge circuit that can control an energization direction of the electrical load 1 by using four MOSFETs 102. FIG. 10 illustrates only two driving transistor control circuit 13H, 13L for controlling ON and OFF of MOSFETs 102H, 102L. The source of the MOSFET 102H and the drain of the MOSFET 102L are commonly connected to one side of the electrical load 1.

In the seventh embodiment, the driving transistor control circuit 113 employs a low side drive configuration in which the MOSFET 2 is connected to a ground side of the electrical load 1. As shown in FIG. 10, the driving transistor control circuit 113 can be applied to a high side drive configuration. It is noted that the source of the MOSFET 105 of the driving transistor control circuit 113H is connected to the power supply voltage +BB that is greater than the power supply voltage +B, and that the source of the MOSFET 105 of the driving transistor control circuit 113L is connected to a power supply voltage +BBB that is independent of the power supply voltage +B.

The driving transistor control circuits 113H, 113L are supplied from an external circuit with control signals INH, INL for controlling ON and OFF of the MOSFETs 102H, 102L, respectively. According to the eighth embodiment, the energization direction of the electrical load 1 can be switched by turning ON the MOSFETs 102H, 102L in an exclusive manner, and switching noise due to the switching of the energization direction can be reduced.

The seventh and eighth embodiments described above can be modified in various ways. For example, the MOSFETs 102, 103 can be a P-channel MOSFET. The MOSFETs 102, 103 can be a MOSFET other than LDMOS. The MOSFETs 102, 103 can be a voltage-controlled transistor other than a MOSFET. For example, the MOSFETs 102, 103 can be an insulated gate bipolar transistor (IGBT).

As to each control transistor, the channel type can be replaced between N-channel and P-channel. The control transistor can be a bipolar transistor.

In the eighth embodiment, only the driving transistor control circuits 113H, 113H can be connected to the electrical load 1 without forming a H-bridge circuit. In this case, when the MOSFET 102H is turned ON, a source current is supplied to the electrical load 1. In contrast, when the MOSFET 102L is turned ON, a sink current is drawn from the electrical load 1.

Such changes and modifications are to be understood as being within the scope of the present invention as defined by the appended claims.

What is claimed is:

1. A driving transistor control circuit for controlling ON and OFF of a driving transistor connected in series with an electrical load between a power supply voltage and a ground, the driving transistor control circuit comprising:
   a pull-up resistor connected at one end to a power supply voltage side of the driving transistor;
   a current detection resistor configured to detect an electric current flowing from the driving transistor to the ground upon turn-ON of the driving transistor;
   a first current mirror circuit including a starting transistor connected between the pull-up resistor and the current detection resistor, the first current mirror circuit supplying a first mirror current mirroring the electric current flowing through the current detection resistor; and
   a driving current source circuit configured to supply a driving current to a control terminal of the driving transistor in accordance with the mirror current to turn ON the driving transistor in response to an external control signal.

2. The driving transistor control circuit according to claim 1, wherein
   the driving current source circuit includes a second current mirror circuit activated by the first mirror current to produce a second mirror current mirroring the first mirror current, a third current mirror circuit activated by the second mirror current to produce a third mirror current mirroring the second mirror current, a fourth current mirror circuit activated by the second mirror current to produce a fourth mirror current mirroring the second mirror current, and a fifth current mirror circuit activated by the fourth mirror circuit to produce the driving current supplied to the control terminal of the driving transistor,
   a mirror side transistor of the third current mirror circuit is connected to the control terminal of the driving transistor,
   the third current mirror circuit is activated when the external control signal is inactive, and
   the fourth current mirror circuit is activated when the external control signal is active.

3. The driving transistor control circuit according to claim 1, further comprising:
   a current detection transistor connected in series with the current detection resistor and connected in parallel with the driving transistor, wherein
   the driving current is supplied to a control terminal of the current detection transistor.

4. The driving transistor control circuit according to claim 1, further comprising:
   a current interrupting switch connected between the pull-up resistor and the starting transistor to interrupt an electric current flowing through the pull-up resistor.

5. The driving transistor control circuit according to claim 4, wherein
   the current interrupting switch is constructed with a transistor.

* * * * *